(12) United States Patent
Tu et al.

(10) Patent No.: US 11,450,708 B2
(45) Date of Patent: Sep. 20, 2022

(54) METAL-OXIDE SEMICONDUCTOR MODULE AND LIGHT-EMITTING DIODE DISPLAY DEVICE INCLUDING THE SAME

(71) Applicants: MACROBLOCK, INC., Hsinchu (TW); FORCE MOS TECHNOLOGY CO., LTD., New Taipei (TW)

(72) Inventors: Kao-Way Tu, Hsinchu (TW); Yuan-Shun Chang, Hsinchu (TW); Li-Chang Yang, Hsinchu (TW); Yi-Sheng Lin, Hsinchu (TW)

(73) Assignees: MACROBLOCK, INC., Hsinchu (TW); FORCE MOS TECHNOLOGY CO., LTD., New Taipei (TW)

( * ) Notice: Subject to any disclaimer, the term of this patent is extended or adjusted under 35 U.S.C. 154(b) by 98 days.

(21) Appl. No.: 17/078,240

(22) Filed: Oct. 23, 2020

(65) Prior Publication Data

US 2021/0126047 A1    Apr. 29, 2021

(30) Foreign Application Priority Data

Oct. 28, 2019 (TW) ................................. 108138870

(51) Int. Cl.
*H01L 27/15* (2006.01)

(52) U.S. Cl.
CPC .................................. *H01L 27/156* (2013.01)

(58) Field of Classification Search
None
See application file for complete search history.

(56) References Cited

U.S. PATENT DOCUMENTS

| | | |
|---|---|---|
| 2009/0195521 A1 | 8/2009 | Chen et al. |
| 2013/0056821 A1 | 3/2013 | Chang et al. |
| 2021/0126047 A1* | 4/2021 | Tu ........................... H01L 33/62 |

FOREIGN PATENT DOCUMENTS

| | | |
|---|---|---|
| JP | 2004289103 A | 10/2004 |
| JP | 2009139904 A | 6/2009 |
| WO | 2009060648 A1 | 5/2009 |

OTHER PUBLICATIONS

Japanese Patent Office, "Notice of Reasons of Refusal," and English translation thereof, issued in Japanese Patent Application No. 2020-179817, dated Oct. 20, 2021, document of 7 pages.
Search Report issued to European counterpart application No. 20204003.6 by the EPO dated Mar. 24, 2021.

\* cited by examiner

*Primary Examiner* — Robert K Carpenter
(74) *Attorney, Agent, or Firm* — Akerman LLP; Peter A. Chiabotti

(57) ABSTRACT

A metal-oxide semiconductor module includes multiple metal-oxide semiconductor components separated from one another by at least one first trench. Each of the metal-oxide semiconductor components includes a heavily doped semiconductor layer which includes a drain region, an epitaxial layer which is formed with an indentation such that the drain region is partially exposed from the epitaxial layer, and a metallic patterned contact unit. The epitaxial layer also includes a source region and a gate region that are spaced-apart formed therein. The metallic patterned contact unit includes source, gate, and drain patterned contacts which are electrically connected to the source, gate, and drain regions, respectively. A light-emitting diode display device including the metal-oxide semiconductor module is also disclosed.

14 Claims, 9 Drawing Sheets

METAL-OXIDE SEMICONDUCTOR MODULE AND LIGHT-EMITTING DIODE DISPLAY DEVICE INCLUDING THE SAME

CROSS-REFERENCE TO RELATED APPLICATION

This application claims priority of Taiwanese Invention Patent Application No. 108138870, filed on Oct. 28, 2019.

FIELD

This disclosure relates to a semiconductor module and a light-emitting diode (LED) display device including the same, and more particularly to a metal-oxide semiconductor module and an LED display device including the same.

BACKGROUND

As miniaturization of portable electronic devices becomes more prevalent, electronic components (e.g., metal-oxide semiconductor components) included therein tend to have a reduced size and exhibit improved performance. However, miniaturization of such semiconductor components has become increasingly challenging due to characteristics of semiconductor materials of the semiconductor components, and various limitations of conventional methods for manufacturing the semiconductor components. Therefore, developing an optimal arrangement of a plurality of the semiconductor components in an integrated semiconductor module so as to effectively reduce the footprint of the semiconductor components when mounted on an electronic circuit board, has become an important goal in semiconductor industry.

SUMMARY

Therefore, an object of the disclosure is to provide a metal-oxide semiconductor module and a light-emitting diode (LED) display device including the same that can alleviate or eliminate at least one of the drawbacks in the prior art.

According to the disclosure, the metal-oxide semiconductor module includes a semiconductor substrate having a first conductivity type, and a plurality of metal-oxide semiconductor components formed on the semiconductor substrate and separated from one another by at least one first trench that extends in a first direction.

Each of the metal-oxide semiconductor components includes a heavily doped semiconductor layer which has a second conductivity type that is opposite to the first conductivity type, an epitaxial layer which has the second conductivity type, and a metallic patterned contact unit. The heavily doped semiconductor layer is formed on the semiconductor substrate and includes a drain region. The epitaxial layer is formed on the heavily doped semiconductor layer opposite to the semiconductor substrate and is formed with an indentation, such that the drain region of the heavily doped semiconductor layer is partially exposed from the epitaxial layer. The epitaxial layer includes a source region and a gate region that are spaced-apart formed therein. The metallic patterned contact unit includes a source patterned contact, a gate patterned contact, and a drain patterned contact. The source patterned contact is formed on an upper surface of the epitaxial layer opposite to the heavily doped semiconductor layer, and is electrically connected to the source region. The gate patterned contact is formed on the upper surface of the epitaxial layer and spaced apart from the source patterned contact, and is electrically connected to the gate region. The drain patterned contact is disposed on and extends from the exposed drain region of the heavily doped semiconductor layer to the upper surface of the epitaxial layer, and is electrically connected to the drain region.

According to the disclosure, the LED display device includes a display substrate, a power circuit, a grounding circuit, an LED array, and the abovementioned metal-oxide semiconductor module. The display substrate has a display area and a non-display area surrounding the display area. The power circuit and the grounding circuit are formed at the non-display area of the display substrate. The LED array is disposed on the display area of the display substrate, and includes a plurality of LEDs that are arranged in a matrix with a plurality of rows and a plurality of columns. The metal-oxide semiconductor module is disposed on the non-display area of the display substrate such that the metallic patterned contact unit of each of the metal-oxide semiconductor components of the metal-oxide semiconductor module is in contact with the display substrate.

BRIEF DESCRIPTION OF THE DRAWINGS

Other features and advantages of the disclosure will become apparent in the following detailed description of the embodiments with reference to the accompanying drawings, in which:

FIGS. 3 to 11 are schematic views illustrating consecutive steps for manufacturing the first embodiment of the metal-oxide semiconductor module of the disclosure, in which FIG. 10 is a fragmentary top view of FIG. 9;

DETAILED DESCRIPTION

Figure 1:
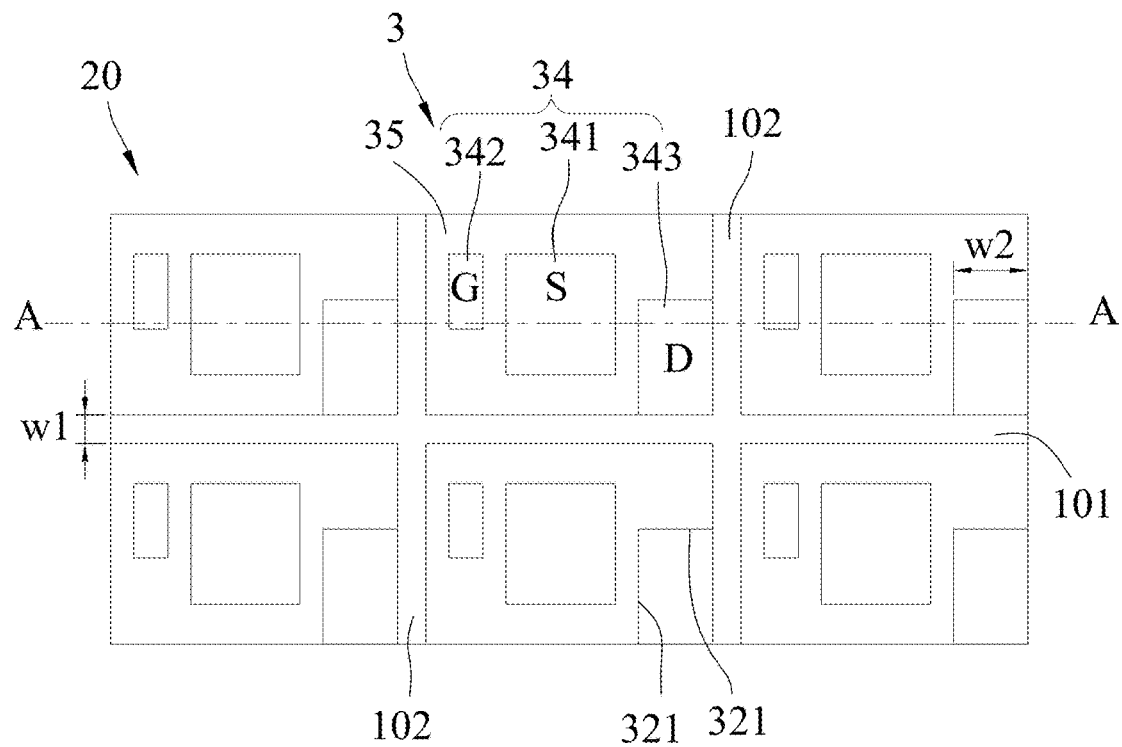
FIG. 1 is a schematic top view illustrating a first embodiment of a metal-oxide semiconductor module according to the disclosure.

Before the disclosure is described in greater detail, it should be noted that where considered appropriate, reference numerals have been repeated among the figures to indicate corresponding or analogous elements, which may optionally have similar characteristics.

To aid in describing the disclosure, directional terms may be used in the specification and claims to describe portions of the present disclosure (e.g., front, rear, left, right, top, bottom, upper, lower, etc.). These directional definitions are intended to merely assist in describing and claiming the disclosure and are not intended to limit the disclosure in any way.

Figure 2:
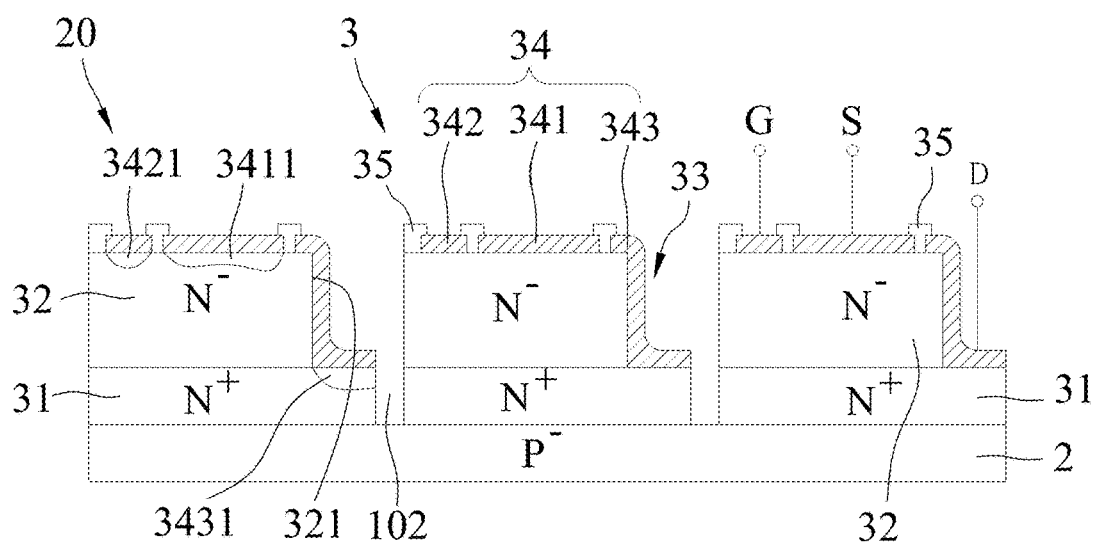
FIG. 2 is a schematic cross-sectional view of the first embodiment of the metal-oxide semiconductor module taken along line A-A of FIG. 1.

Referring to FIGS. 1 and 2, a first embodiment of a metal-oxide semiconductor module 20 according to the disclosure includes a semiconductor substrate 2 having a first conductivity type, and a plurality of metal-oxide semiconductor components 3 formed on the semiconductor substrate 2 and separated from one another by at least one first trench 101 that extends in a first direction. The metal-oxide semiconductor module 20 may further include at least one second trench 102 which extends in a second direction intersecting the first direction, and which cooperates with the first trench 101 to separate the metal-oxide semiconductor components 3 from one another. In this embodiment, the first direction is the longitudinal direction, and the second direction is the transverse direction. The metal-oxide semiconductor module 20 includes six metal-oxide semiconductor components 3 that are arranged in an array, and that are separated by one first trench 101 and two second trenches 102. However, the numbers of the first and/or second trenches 101, 102 may be adjusted based on actual requirements for the number and arrangement of the metal-oxide semiconductor components 3, and are not limited to those shown in FIG. 1. For example, the metal-oxide semiconductor module 20 may include four metal-oxide semiconductor components 3 that are aligned in the first direction and separated by three second trenches 102. Alternatively, the four metal-oxide semiconductor components 3 may be arranged in a 2×2 matrix and separated by one first trench 101 and one second trench 102.

Each of the metal-oxide semiconductor components 3 includes a heavily doped semiconductor layer 31 which has a second conductivity type opposite to the first conductivity type, an epitaxial layer 32 which has the second conductivity type, a metallic patterned contact unit 34, and an electrically insulating protective layer 35. Each of the metal-oxide semiconductor components 3 may be a trench metal-oxide semiconductor component.

In certain embodiments, one of the first and second conductivity types is P-type, and the other one of the first and second conductivity types is N-type. In this embodiment, the first conductivity type is P-type, and the second conductivity type is N-type.

The heavily doped semiconductor layer 31 is formed on the semiconductor substrate 2 and includes a drain region 3431. The epitaxial layer 32 is formed on the heavily doped semiconductor layer 31 opposite to the semiconductor substrate 2, and is formed with an indentation 33 such that the drain region 3431 of the heavily doped semiconductor layer 31 is partially exposed from the epitaxial layer 32. The heavily doped semiconductor layer 31 may have a doping concentration that is greater than that of the epitaxial layer 32.

The indentation 33 may be formed at a corner region of the epitaxial layer 32, and is defined by an indentation-defining wall. The cross section of the indentation-defining wall may be in a shape of circle, quadrilateral, oval, triangle, etc. In this embodiment, the indentation 33 of each of the metal-oxide semiconductor components 3 is in communication with the first and/or second trenches 101, 102. The cross section of the indentation-defining wall is in a shape of a rectangle, and the indentation-defining wall includes two sidewall portions 321 of the epitaxial layer 32 that connect with and are perpendicular to each other. The epitaxial layer 32 includes a source region 3411 and a gate region 3421 that are spaced-apart formed therein. The structures of the gate region 3421 and the source region 3411, which are well known to those skilled in the art and are not limited specifically, may be manufactured based on practical requirements, and thus the details thereof are not described herein for the sake of brevity. The gate region 3421 may have a trench structure or a planar structure, but is not limited thereto.

The metallic patterned contact unit 34 includes a source patterned contact 341, a gate patterned contact 342, and a drain patterned contact 343. The source patterned contact 341 is formed on an upper surface of the epitaxial layer 32 opposite to the heavily doped semiconductor layer 31, and is electrically connected to the source region 3411. The source patterned contact 341 and the source region 3411 cooperate to form a source electrode (S). The gate patterned contact 342 is formed on the upper surface of the epitaxial layer 32 and spaced apart from the source patterned contact 341, and is electrically connected to the gate region 3421. The gate patterned contact 342 and the gate region 3421 cooperate to form a gate electrode (G). The drain patterned contact 343 is disposed on and extends from the exposed drain region 3431 of the heavily doped semiconductor layer 31 to the upper surface of the epitaxial layer 32 along the sidewall portions 321, and is electrically connected to the drain region 3431. The drain patterned contact 343 and the drain region 3431 cooperate to form a drain electrode (D).

In certain embodiments, an area of the exposed drain region 3431 is smaller than an area of the indentation 33, so as to ensure that the drain patterned contact 343 does not extend to the first and/or second trenches 101, 102. In certain embodiments, a width of the indentation 33 (w2) is greater than a distance (w1) between two adjacent ones of the metal-oxide semiconductor components 3 (see FIG. 1), so as to reduce an overall size of the metal-oxide semiconductor module 20.

The electrically insulating protective layer 35 is disposed on the upper surface of the epitaxial layer 32, and formed among the gate patterned contact 342, the source patterned contact 341, and the drain patterned contact 343 so as to electrically isolate the gate, source, and drain regions 3411, 3421, 3431 from one another (i.e., to electrically isolate the gate, source, and drain electrodes G, S, and D from one another). In certain embodiments, the electrically insulating protective layer 35 is made of a passivation material.

By virtue of the structural design of the metal-oxide semiconductor components 3 which are formed on the same semiconductor substrate 2 for packaging, the metal-oxide semiconductor module 20 of this disclosure may have a reduced footprint on a printed circuit board, thereby reducing manufacturing cost thereof.

In addition, since the drain patterned contact 343 extends from the exposed drain region of the heavily doped semiconductor layer 31 to the upper surface of the epitaxial layer 32 through the indentation 33, the source, gate, and drain electrodes (S, G, and D) of each of the metal-oxide semiconductor components 3 may be formed on the same plane (i.e., the upper surface of the epitaxial layer 32), thereby simplifying a packaging process of the metal-oxide semiconductor module 20. Further, since the drain patterned contact 343 is located at the corner region of the metal-oxide semiconductor component 3, it may be easier for an external power supply to connect to the drain patterned contact 343.

Referring to FIGS. 3 to 11, a method of manufacturing the abovementioned metal-oxide semiconductor module 20 of the disclosure includes the following steps.

Figure 3:
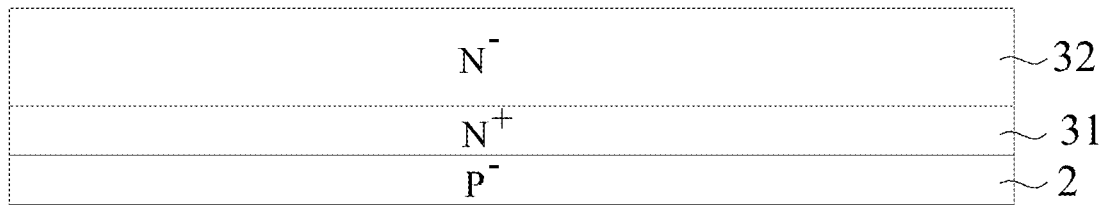

First, referring to FIG. 3, a wafer is prepared by forming the heavily doped semiconductor layer 31 and the epitaxial layer 32 on the semiconductor substrate 2 in such order. The semiconductor substrate 2 has the P-type conductivity type, and the heavily doped semiconductor layer 31 and the epitaxial layer 32 have the N-type conductivity type.

Figure 4:
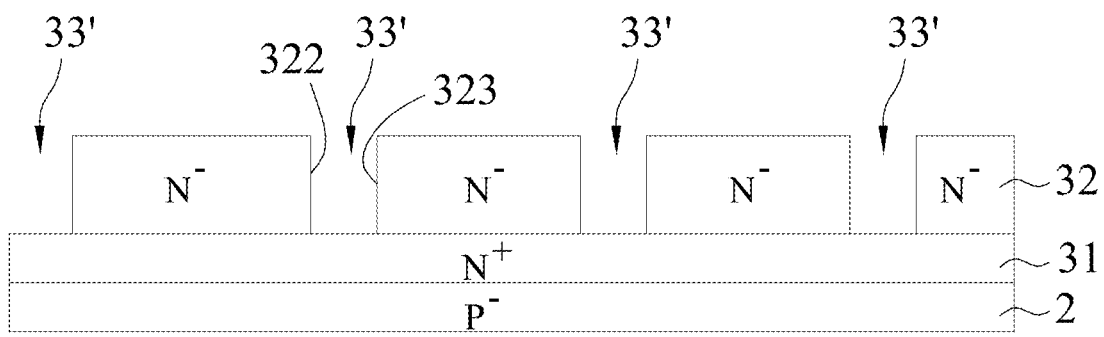
Figure 5:
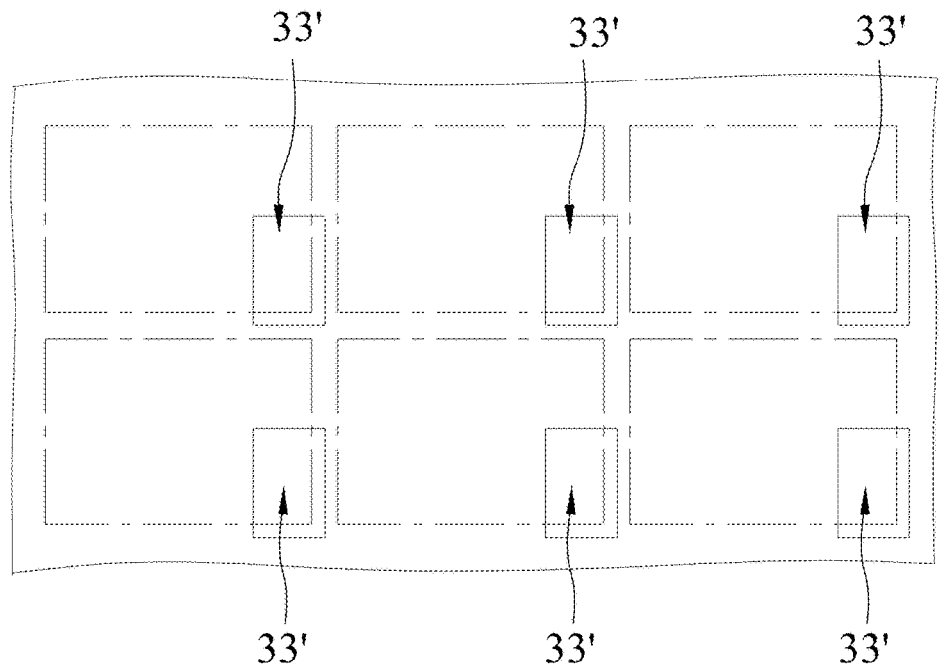

Next, referring to FIG. 4, the epitaxial layer 32 is etched downwardly from the upper surface of the epitaxial layer 32 to form a plurality of spaced-apart recesses 33' that partially expose the heavily doped semiconductor layer 31, and side walls 322, 323 of the epitaxial layer 32. Further, referring to FIG. 5, the recesses 33' are arranged in a matrix and correspond in position to the indentations 33 to be formed on the metal-oxide semiconductor components 3 (i.e., regions indicated by phantom lines). The locations, sizes, and shapes of the recesses 33' are not limited to those disclosed herein, and may be modified based on practical requirements. In this embodiment, the recesses 33' are located at the corner regions of respective ones of the metal-oxide semiconductor components 3 to be formed, and have the same size.

Figure 6:
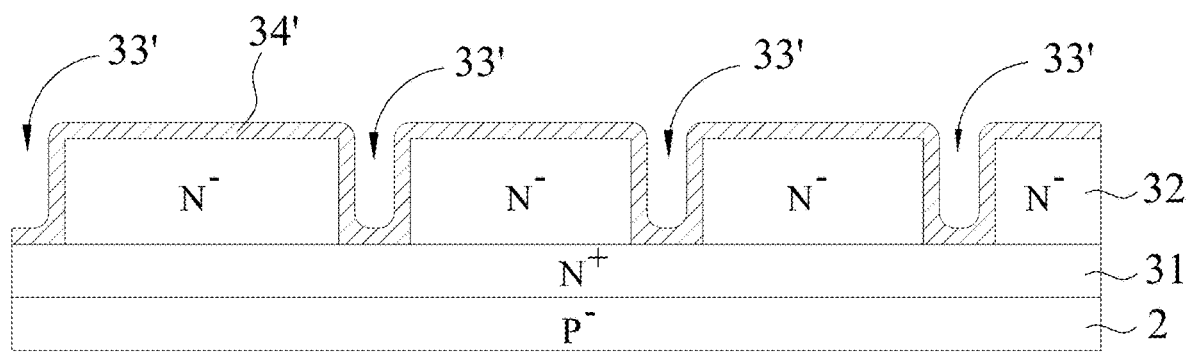

Thereafter, referring to FIG. 6, a metallic layer 34' is formed over the epitaxial layer 32 and the exposed portions of the heavily doped semiconductor layer 31. To be specific, the metallic layer 34' covers the upper surface and the side walls 322, 323 of the epitaxial layer 32, and the exposed portions of the heavily doped semiconductor layer 31.

Figure 7:
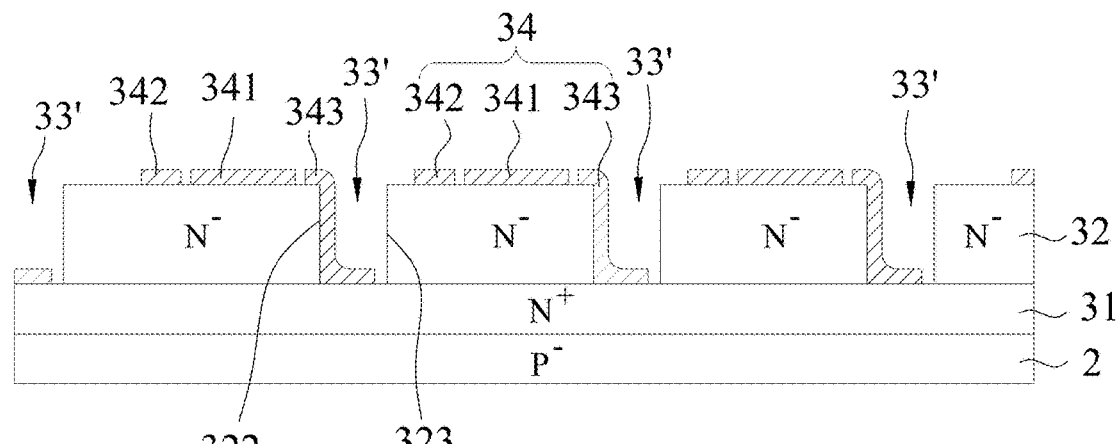

Subsequently, referring to FIG. 7, the metallic layer 34' is subjected to a photolithography process to form the metallic patterned contact unit 34. Specifically, a portion of the metallic layer 34' which covers each of the side walls 323 of the epitaxial layer 32 and covers a part of the heavily doped semiconductor layer 31 that is immediately connected to the side walls 323 is removed, and meanwhile another portion of the metallic layer 34' on the upper surface of the epitaxial layer 32 is patterned. As such, the side walls 323 of the epitaxial layer 32 and the part of the heavily doped semiconductor layer 31 that is immediately connected to the side walls 323 are exposed from the metallic layer 34', and the remaining portion of the metallic layer 34' is formed as the metallic patterned contact unit 34 on each of the metal-oxide semiconductor components 3 to be formed. The metallic patterned contact unit 34 includes the source, gate, and drain patterned contacts 341, 342, 343 which are separated from one another.

Figure 8:
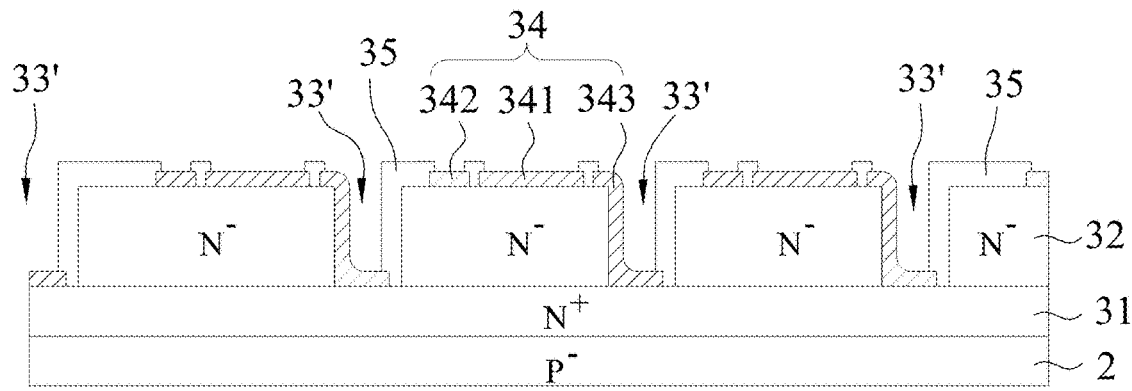

After then, referring to FIG. 8, the electrically insulating protective layer 35 is formed on the portions of the epitaxial layer 32 and the heavily doped semiconductor layer 31 exposed from the metallic patterned contact unit 34. To be specific, the electrically insulating protective layer 35 fills the exposed portions of the upper surface of the epitaxial layer 32 located among the source, gate and drain patterned contacts 341, 342, 343, and covers the side walls 323, such that the gate, source, and drain patterned contacts 342, 341, 343 are isolated from one another by the electrically insulating protective layer 35.

Figure 9:
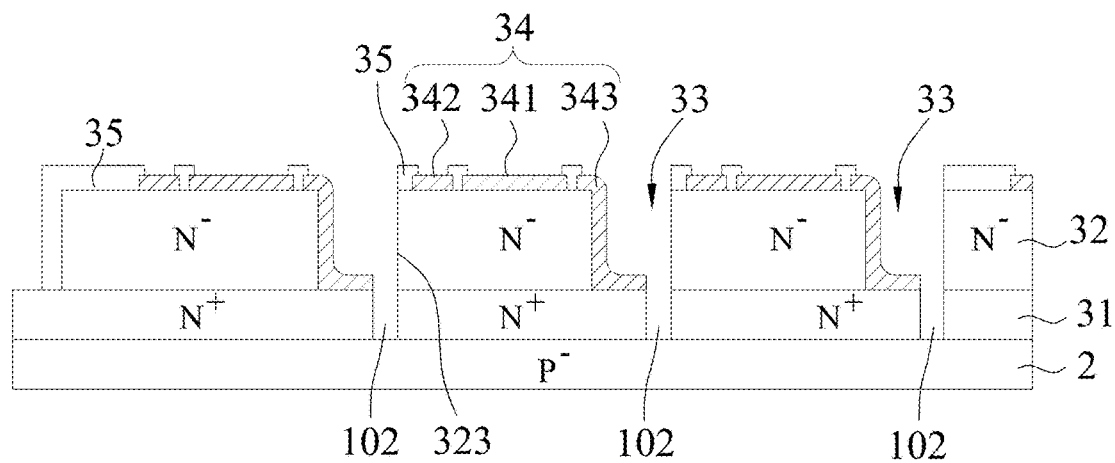
Figure 10:
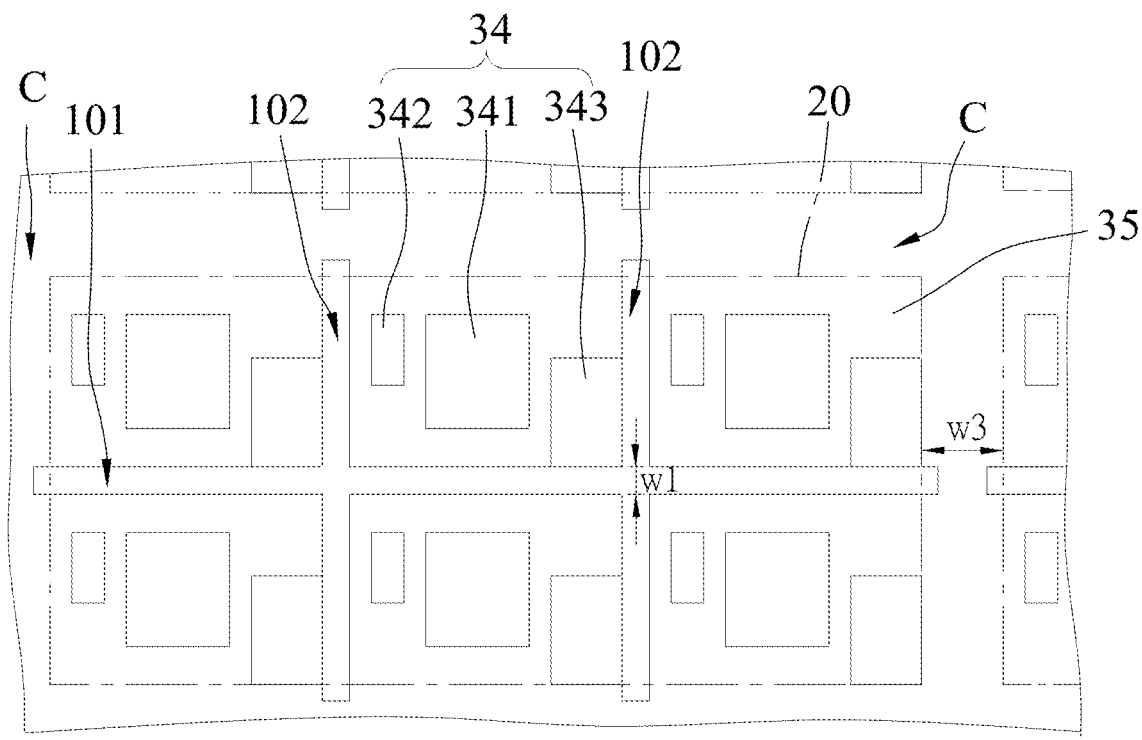

Next, referring to FIGS. 9 and 10, one first trench 101 which extends in the longitudinal direction and two second trenches 102 which extend in the transverse direction and traverse to the first trench 101 are formed in a respective one of the metal-oxide semiconductor modules 20 to be manufactured. Specifically, the wafer is subjected to an etching process to remove a portion of the electrically insulating protective layer 35 that covers the side walls 323 of the epitaxial layer 32, a portion of the drain patterned contact 343 that covers the heavily doped semiconductor layer 31, and a portion of the heavily doped semiconductor layer 31 so as to partially expose the semiconductor substrate 2. That is, each of the first and second trenches 101, 102 are formed to extend through the epitaxial layer 32 and the heavily doped semiconductor layer 31 and to terminate at and expose the semiconductor substrate 2, such that a plurality of the metal-oxide semiconductor components 3 separated from one another on the semiconductor substrate 2 are obtained. Each of the recesses 33' is formed as a respective one of the indentations 33 of the metal-oxide semiconductor components 3. It should be noted that, in this embodiment, the first and second trenches 101, 102 partially overlap with the recesses 33' (see FIG. 5), and therefore the indentations 33 thus formed are connected to the first and second trenches 101, 102. Alternatively, the indentations 33 may be connected to only the first trench 101 or only the second trench 102.

Figure 11:
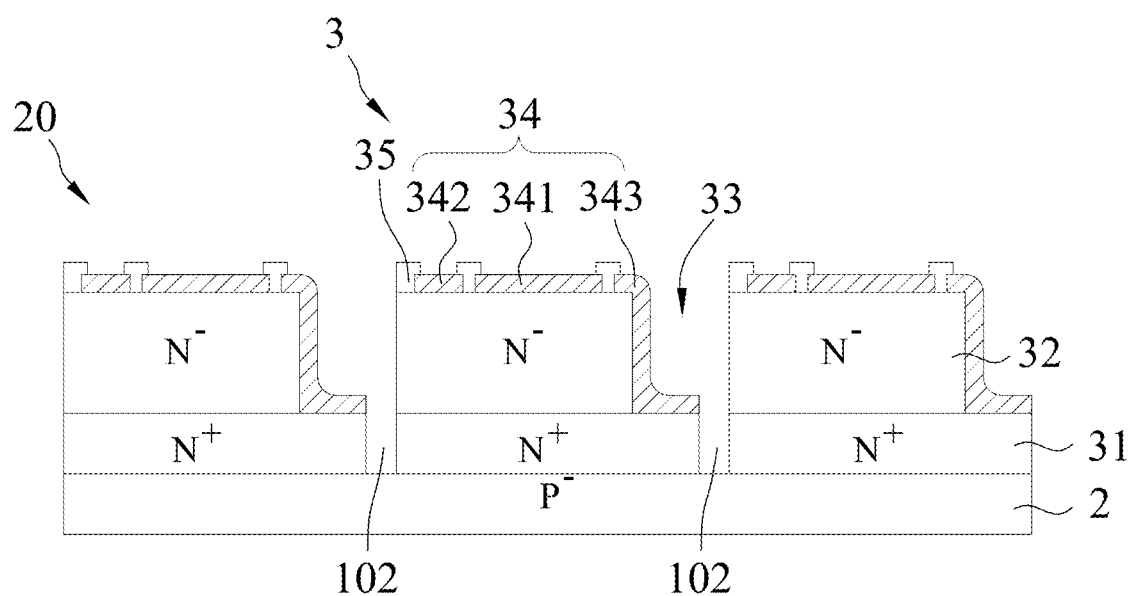

Finally, referring to FIGS. 10 and 11, the wafer is diced along a scribe line C to cut the semiconductor substrate 2, thereby obtaining a plurality of the metal-oxide semiconductor modules 20 each including six of the metal-oxide semiconductor components 3 separated from one another by the first and second trenches 101, 102. It should be noted that, since the first and second trenches 101, 102 are merely configured to electrically isolate the metal-oxide semiconductor components 3 from one another, relatively narrow widths of the first and second trenches 101, 102 (i.e., the distance between two adjacent ones of the metal-oxide semiconductor components 3) would be sufficient for the middle voltage or low voltage metal-oxide semiconductor components 3. In certain embodiments, the width (w1) of each of the first and second trenches 101, 102 is smaller than a width (w3) of the scribe line C, so that the wafer is used more efficiently.

Figure 12:
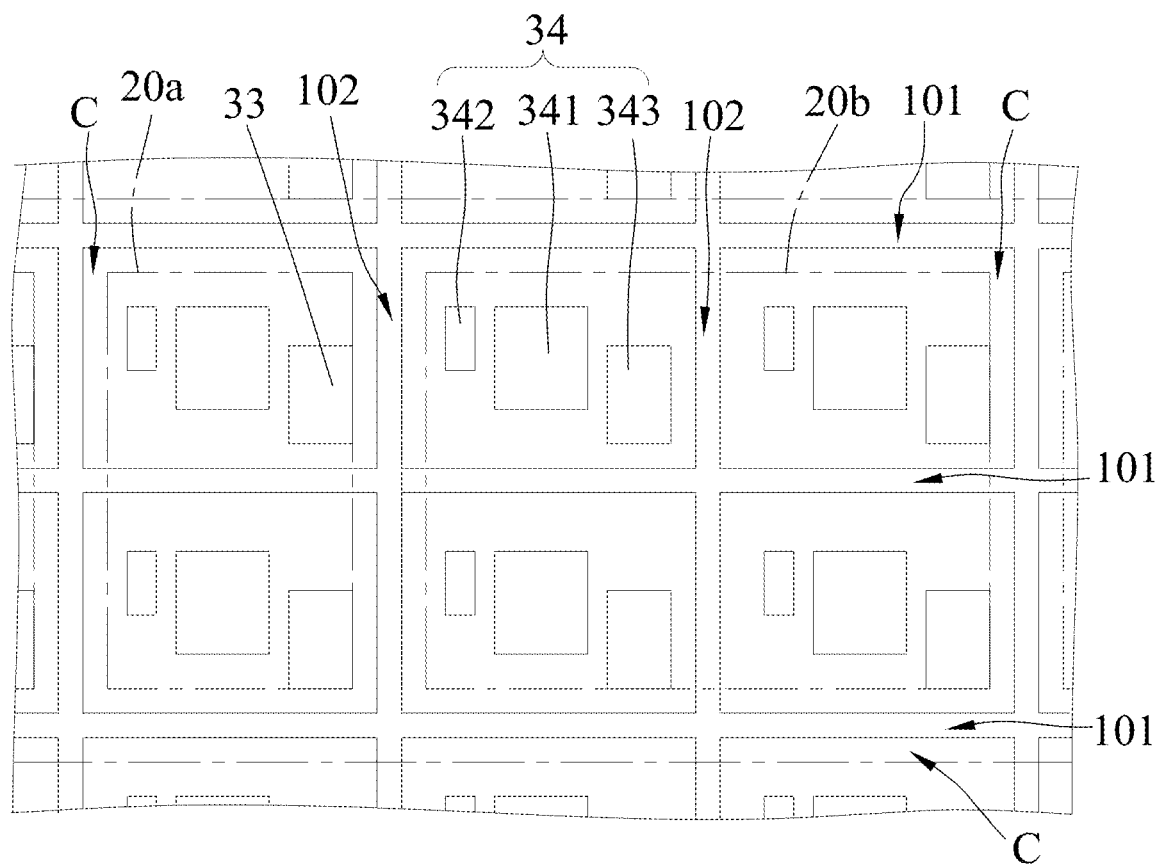
FIG. 12 is a fragmentary top view illustrating a second embodiment of the metal-oxide semiconductor module according to the disclosure.

Referring to FIG. 12, a second embodiment of the metal-oxide semiconductor module 20 is generally made by procedures similar to those of the first embodiment except that in the second embodiment, the indentations 33 are not connected to the first and/or second trenches 101, 102. That is to say, during the manufacturing process of the second embodiment of the metal-oxide semiconductor module 20, the recesses 33' do not overlap with the first and second trenches 101, 102. As such, the distance between two adjacent ones of the metal-oxide semiconductor components 3 (i.e., the widths (w1) of the first and second trenches 101, 102) may be increased, and therefore the first and second trenches 101, 102 may also serve as scribe lines when the wafer is diced to obtain the metal-oxide semiconductor modules 20. The size of each of the thus obtained metal-oxide semiconductor modules 20 may be adjusted based on practical requirements. That is, since the first and second trenches 101, 102 also serve as scribe lines, the metal-oxide semiconductor modules 20 may independently include different numbers of the metal-oxide semiconductor components 3. For example, in this embodiment, a metal-oxide semiconductor module 20a may include two of the metal-oxide semiconductor components 3, and another metal-oxide semiconductor module 20b may include four of the metal-oxide semiconductor components 3.

In certain embodiments, the first and/or second trenches 101, 102 may be filled with an electrically insulating material (not shown), so as to electrically isolate the metal-oxide semiconductor components 3 from one another. As such, the required widths of the first and second trenches 101, 102 may be further reduced, and a structural strength of the metal-oxide semiconductor module 20 may be further improved.

Figure 13:
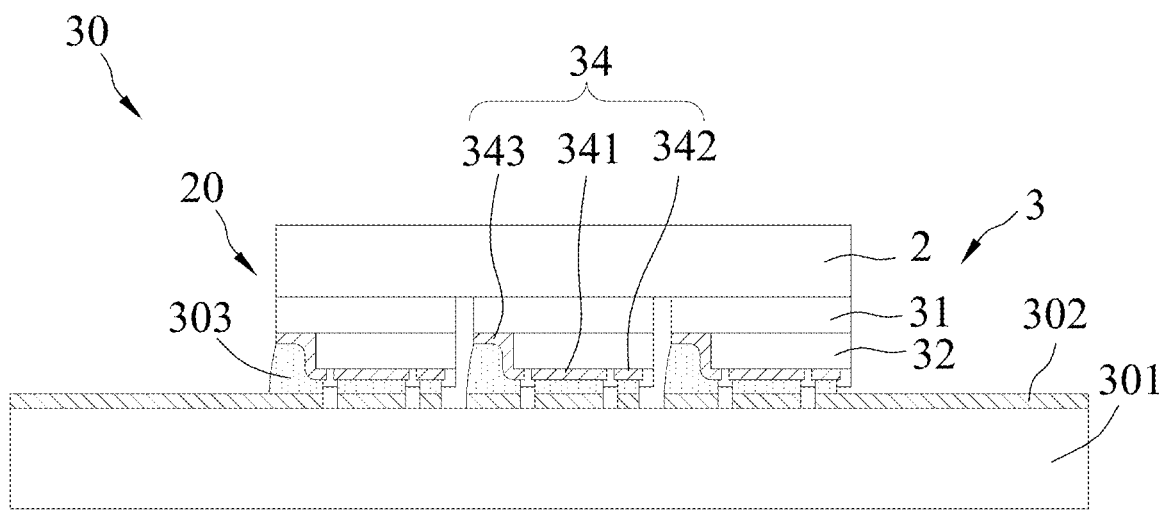
FIG. 13 is a schematic cross-sectional view illustrating a power control device including the first embodiment of the metal-oxide semiconductor module.

Referring to FIG. 13, a power control device 30 includes an electric circuit board 301 and the first embodiment of the metal-oxide semiconductor module 20. The electric circuit board 301 has a circuit pattern 302 printed on an upper surface thereof. The metal-oxide semiconductor module 20 is flipped and disposed on the upper surface of the electric circuit board 301 such that the source, gate, and drain patterned contacts 341, 342, 343 of each of the metal-oxide semiconductor components 3 are individually and electrically connected to the circuit pattern 302 of the electric circuit board 301 via, e.g., a solder 303. Alternatively, the metal-oxide semiconductor module 20 may be bound to the electric circuit board 301 using an electrically conductive adhesive.

Referring to FIGS. 14 to 17, a light-emitting diode (LED) display device 40 according to the disclosure includes a display substrate 41, an LED array 42, a power circuit 43, a grounding circuit 44, and the metal-oxide semiconductor module 20 of this disclosure.

The LED display device 40 may be any display or lighting device which controls the LED array using a plurality of the metal-oxide semiconductor components 3 of the metal-oxide semiconductor module 20. For example, the LED display device 40 may be a passive matrix LED display device, but is not limited thereto.

The display substrate 41 has a display area 41a and a non-display area 41b surrounding the display area 41a. The power circuit 43 and the grounding circuit 44 are formed at the non-display area 41b, and are configured to provide electric power.

The LED array 42 is disposed on the display area 41a of the display substrate 41, and includes a plurality of LEDs that are arranged in a matrix with a plurality of rows (denoted as row0, row1 to rown) and a plurality of columns (denoted as col0, col1 to colm). Each of the LEDs of the LED array 42 is located at an intersecting point of the rows and columns.

The metal-oxide semiconductor module 20 is disposed on the non-display area 41b of the display substrate 41, such that the metallic patterned contact unit 34 of each of the metal-oxide semiconductor components 3 of the metal-oxide semiconductor module 20 is in contact with the display substrate 41 in a manner similar to FIG. 13.

Figure 14:
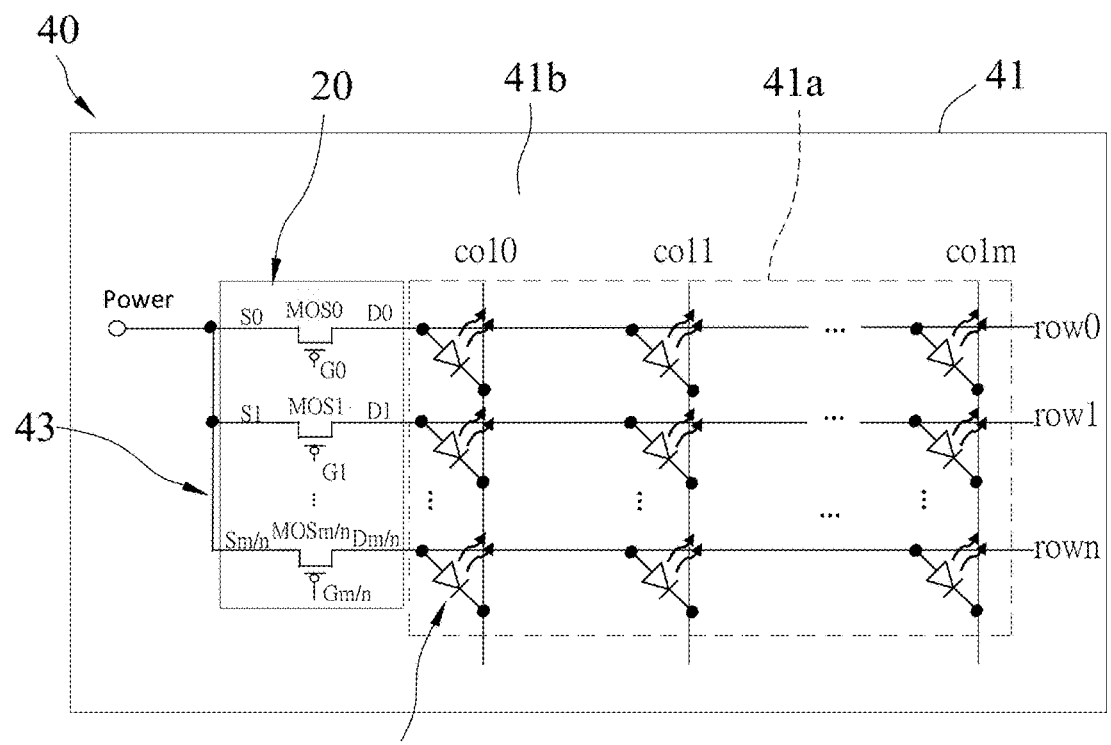
FIGS. 14 and 15 are circuit diagrams illustrating a configuration of the metal-oxide semiconductor module and an LED array in a light-emitting diode (LED) display device according to the disclosure.
Figure 15:
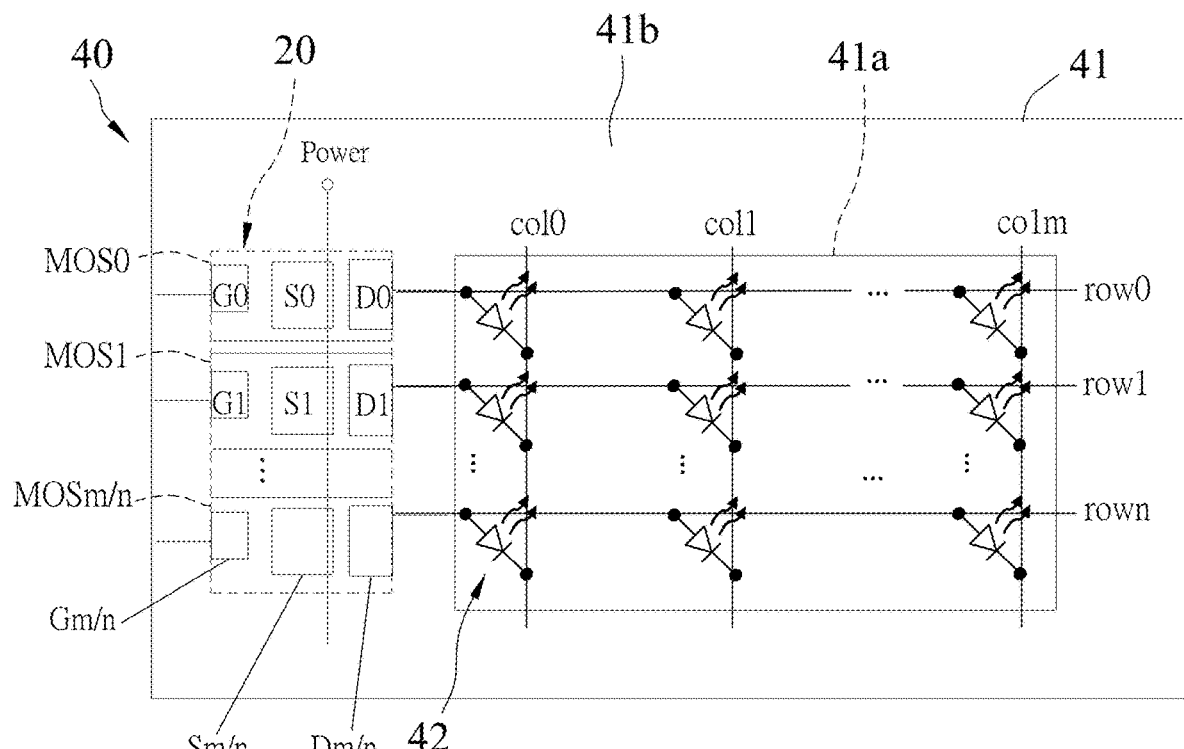

In one form of the LED display device 40, referring to FIGS. 14 and 15, the metal-oxide semiconductor components 3 are arranged in one column (denoted as MOS0, MOS1 to MOSm/n). For each of the metal-oxide semiconductor components 3, the gate patterned contact 342, the source patterned contact 341 and the drain patterned contact 343 are arranged in such order along a direction away from the light-emitting diode array 42. Each of the metal-oxide semiconductor components 3 may be a P-type metal-oxide semiconductor component. The drain region 3431 (denoted as D0, D1 to Dm/n) of each of the metal-oxide semiconductor components 3 is electrically connected to a respective one of the rows of the LEDs, the source region 3411 (denoted as S0, S1 to Sm/n) of each of the metal-oxide semiconductor components 3 is electrically connected to the power circuit 43 to receive a drive current, and the gate region 3421 (denoted as G0, G1 to Gm/n) of each of the metal-oxide semiconductor components 3 is configured to receive a sequence signal, so as to control the on-state or off-state of each of the metal-oxide semiconductor components 3. As such, the metal-oxide semiconductor components 3 (MOS0 to MOSm/n) can be sequentially turned to on-state by the sequence signals, and then the drive current can be provided to each of the rows (row0 to rown) of the LEDs.

Figure 16:
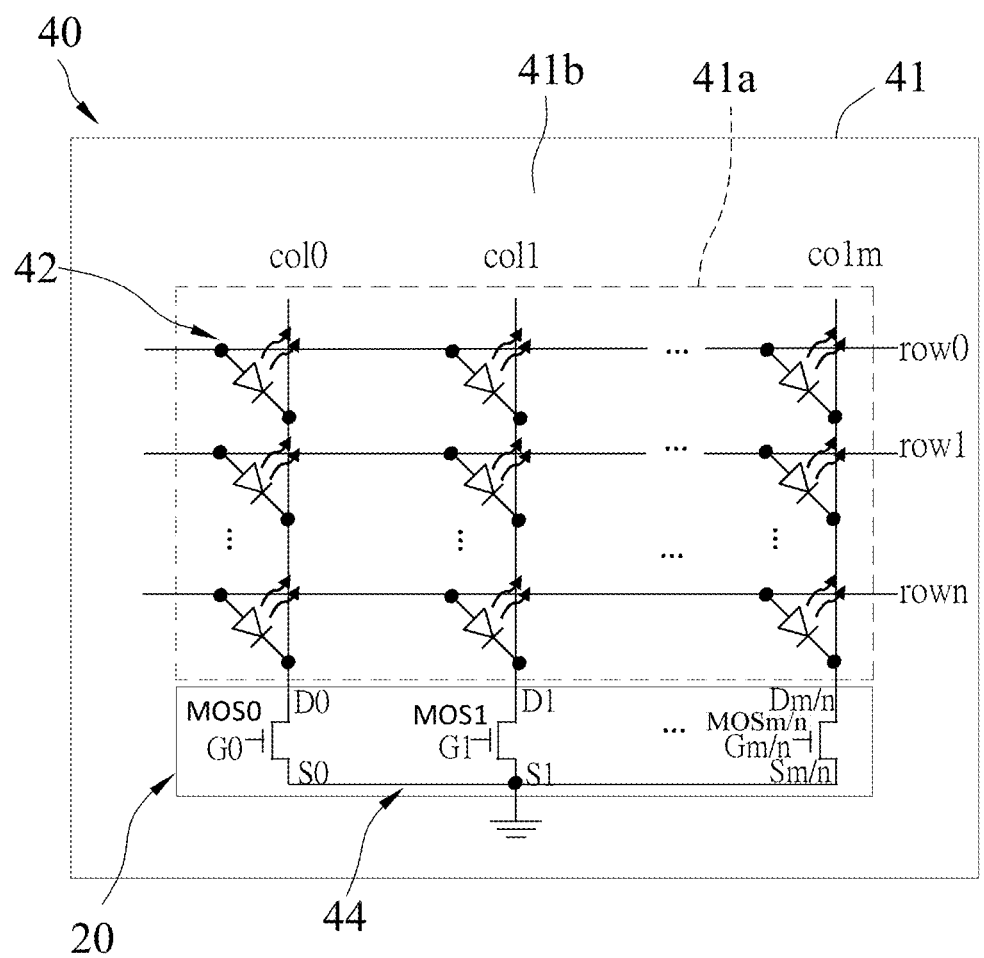
FIGS. 16 and 17 are circuit diagrams illustrating another configuration of the metal-oxide semiconductor module and the LED array in the LED display device according to the disclosure.
Figure 17:
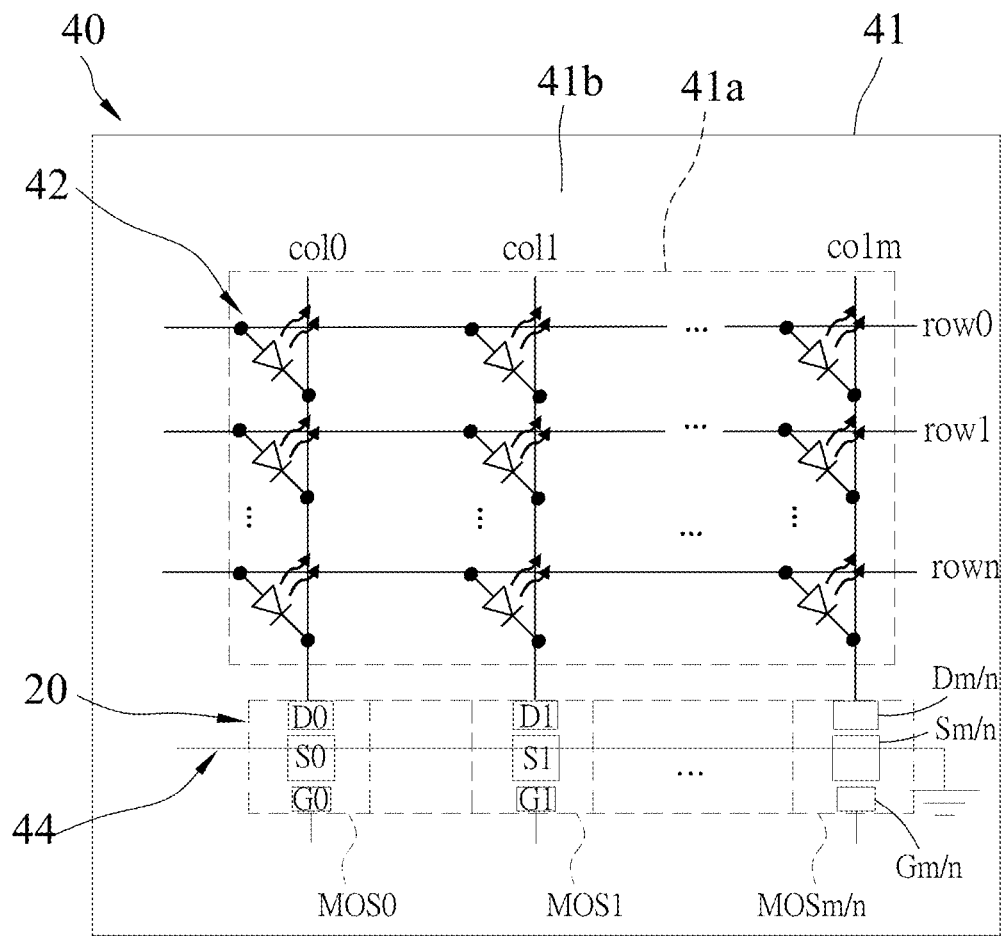

In another form of the LED display device 40, referring to FIGS. 16 and 17, the metal-oxide semiconductor components 3 are arranged in one row (denoted as MOS0, MOS1 to MOSm/n). For each of the metal-oxide semiconductor components 3, the gate patterned contact 342, the source patterned contact 341 and the drain patterned contact 343 are arranged in such order along a direction away from the light-emitting diode array 42. Each of the metal-oxide semiconductor components 3 may be an N-type metal-oxide semiconductor component. The drain region 3431 (denoted as D0, D1 to Dm/n) of each of the metal-oxide semiconductor components 3 is electrically connected to a respective one of the columns (denoted as col0 to colm) of the LEDs, the source region 3411 (denoted as S0, S1 to Sm/n) of each of the metal-oxide semiconductor components 3 is electrically connected to the grounding circuit 44, and the gate region 3421 (denoted as G0, G1 to Gm/n) of each of the metal-oxide semiconductor components 3 is configured to receive a sequence signal, so as to control the on-state or off-state of each of the metal-oxide semiconductor components 3. As such, the metal-oxide semiconductor components 3 (MOS0 to MOSm/n) can be sequentially turned to on-state by the sequence signals, and then the drive current can be provided to each of the columns (col0 to colm) of the LEDs.

By replacing a conventional control unit having multiple switching elements with the metal-oxide semiconductor module 20 of this disclosure to control the on-state or off-state of the LED array, the circuit layout of the LED display device 40 of this disclosure may be simplified, and manufacturing cost thereof may be reduced.

In sum, by virtue of arranging multiple metal-oxide semiconductor components 3 on a same semiconductor substrate, the metal-oxide semiconductor module 20 of this disclosure can be directly used in chip-scale package, and has a reduced footprint when mounted to a printed circuit board, thereby reducing manufacturing cost thereof.

In addition, by virtue of extending the drain patterned contact 343 from the exposed drain region of the heavily doped semiconductor layer 31 to the upper surface of the epitaxial layer 32 through the indentation 33, the drain electrode (D) of each of the metal-oxide semiconductor components 3 may be formed on the same plane as those of the source and gate electrodes (S, G), so as to ensure the drain electrode (D) is connected to an external power supply.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A metal-oxide semiconductor module, comprising:
a semiconductor substrate having a first conductivity type; and
a plurality of metal-oxide semiconductor components formed on said semiconductor substrate, arranged in an array, and separated from one another by at least one first trench that extends in a first direction and at least one second trench that extends in a second direction intersecting the first direction, each of said metal-oxide semiconductor components including:
a heavily doped semiconductor layer which is formed on said semiconductor substrate, which includes a drain region, and which has a second conductivity type that is opposite to the first conductivity type;
an epitaxial layer which is formed on said heavily doped semiconductor layer opposite to said semiconductor substrate, which has the second conductivity type, and which is formed with an indentation such that said drain region of said heavily doped semiconductor layer is partially exposed from said epitaxial layer, said epitaxial layer including a source region and a gate region that are spaced-apart formed therein; and
a metallic patterned contact unit which includes
a source patterned contact that is formed on an upper surface of said epitaxial layer opposite to said heavily doped semiconductor layer and that is electrically connected to said source region,
a gate patterned contact that is formed on the upper surface of said epitaxial layer and spaced apart from said source patterned contact, and that is electrically connected to said gate region, and
a drain patterned contact that is disposed on and extends from the exposed drain region of said heavily doped semiconductor layer to the upper surface of said epitaxial layer, and that is electrically connected to said drain region,
wherein each of said at least one first trench and said at least one second trench extends through said epitaxial layer and said heavily doped semiconductor layer of each of said metal-oxide semiconductor components, and terminates at and exposes said semiconductor substrate, and
wherein said indentation of each of said metal-oxide semiconductor components is not connected to said at least one first trench and said at least one second trench.

2. The metal-oxide semiconductor module according to claim 1, wherein one of the first and second conductivity types is P-type, and the other one of the first and second conductivity types is N-type.

3. The metal-oxide semiconductor module according to claim 1, wherein said indentation is formed at a corner region of said epitaxial layer.

4. The metal-oxide semiconductor module according to claim 3, wherein said indentation is defined by an indentation-defining surface that includes two sidewall portions of said epitaxial layer which connect with each other.

5. The metal-oxide semiconductor module (20) according to claim 1, wherein each of said metal-oxide semiconductor components is a trench metal-oxide semiconductor component.

6. The metal-oxide semiconductor module according to claim 1, further comprising an electrically insulating protective layer which is disposed on the upper surface of said epitaxial layer, and formed among said gate patterned contact, said source patterned contact, and said drain patterned contact to electrically isolate said gate, source, and drain regions from one another.

7. The metal-oxide semiconductor module according to claim 6, wherein said electrically insulating protective layer is made of a passivation material.

8. The metal-oxide semiconductor module according to claim 1, wherein said heavily doped semiconductor layer has a doping concentration that is greater than that of said epitaxial layer.

9. A light-emitting diode display device, comprising:
a display substrate which has a display area and a non-display area surrounding said display area;
a power circuit and a grounding circuit formed at said non-display area of said display substrate;
a light-emitting diode array which is disposed on said display area of said display substrate, and which includes a plurality of light-emitting diodes that are arranged in a matrix with a plurality of rows and a plurality of columns; and
a metal-oxide semiconductor module as claimed in claim 1, which is disposed on said non-display area of said display substrate such that said metallic patterned contact unit of each of said metal-oxide semiconductor components of said metal-oxide semiconductor module is in contact with said display substrate.

10. The light-emitting diode display device according to claim 9, wherein said drain region of each of said metal-oxide semiconductor components is electrically connected to a respective one of said rows of said light-emitting diodes, said source region of each of said metal-oxide semiconductor components is electrically connected to said power circuit, and said gate region of each of said metal-oxide semiconductor components is configured to receive a sequence signal.

11. The light-emitting diode display device according to claim 10, wherein each of said metal-oxide semiconductor components is a P-type metal-oxide semiconductor component.

12. The light-emitting diode display device according to claim 9, wherein for each of said metal-oxide semiconductor components, said gate patterned contact, said source patterned contact and said drain patterned contact are arranged in such order along a direction away from said light-emitting diode array.

13. The light-emitting diode display device according to claim 9, wherein said drain region of each of said metal-oxide semiconductor components is electrically connected to a respective one of said columns of said light-emitting diodes, said source region of each of said metal-oxide semiconductor components is electrically connected to said grounding circuit, and said gate region of each of said metal-oxide semiconductor components is configured to receive a sequence signal.

14. The light-emitting diode display device according to claim 13, wherein each of said metal-oxide semiconductor components is an N-type metal-oxide semiconductor component.

* * * * *